United States Patent
Mamidipaka

(10) Patent No.: US 7,750,680 B2
(45) Date of Patent: *Jul. 6, 2010

(54) AUTOMATIC EXTENSION OF CLOCK GATING TECHNIQUE TO FINE-GRAINED POWER GATING

(75) Inventor: Mahesh Mamidipaka, Santa Clara, CA (US)

(73) Assignee: Apache Design Solutions, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/952,937

(22) Filed: Dec. 7, 2007

(65) Prior Publication Data

US 2008/0088344 A1    Apr. 17, 2008

Related U.S. Application Data

(63) Continuation of application No. 11/193,149, filed on Jul. 29, 2005, now Pat. No. 7,323,909.

(51) Int. Cl.
*H03K 19/00*    (2006.01)

(52) U.S. Cl. .............................. 326/93; 326/95; 326/98
(58) Field of Classification Search ............ 326/93–98; 327/291, 295–296, 298–299
See application file for complete search history.

(56) References Cited

U.S. PATENT DOCUMENTS

| 5,764,710 A * | 6/1998 | Cheng et al. ................ 375/371 |
| 6,586,982 B2 * | 7/2003 | Furusawa et al. ............ 327/225 |
| 7,042,267 B1 * | 5/2006 | Pasqualini ................... 327/291 |
| 7,102,382 B2 | 9/2006 | Drenth et al. |
| 7,323,909 B2 * | 1/2008 | Mamidipaka ................ 326/93 |

* cited by examiner

*Primary Examiner*—Anh Q Tran
(74) *Attorney, Agent, or Firm*—Haynes and Boone, LLP

(57) ABSTRACT

A method extends a clock-gating technique to provide a sleep signal for controlling switch circuits that reduce active leakage power. Using this extension of the clock-gating technique, fine-grained power-gating is achieved. The method automatically identifies, at an RTL or a gate level, the logic circuits that can be power-gated. The method of the present invention derives a sleep signal for fine-grained power-gating that may be applicable to both time-critical and non-time-critical designs.

21 Claims, 4 Drawing Sheets

AUTOMATIC EXTENSION OF CLOCK GATING TECHNIQUE TO FINE-GRAINED POWER GATING

CROSS REFERENCE TO RELATED APPLICATIONS

The present application is a continuation of U.S. patent application Ser. No. 11/193,149 filed on Jul. 29, 2005 now U.S. Pat. No. 7,323,909, incorporated herein by reference.

BACKGROUND OF THE INVENTION

1. Field of the Invention

The present invention relates to techniques for creating low-power integrated circuits. In particular, the present invention relates to techniques designed for creating low-power integrated circuits using a power-gating technique.

2. Discussion of the Related Art

Power-gating is a circuit level technique applicable to, for example, multi-threshold CMOS (MTCMOS) circuits to reduce leakage power (i.e., to reduce power dissipation due to leakage current). In power-gating, a switch cell is introduced between a functional circuit and a power supply voltage reference or a ground voltage reference, so that the functional circuit can be selectively electrically connected or disconnected from a power source or the ground reference by deasserting or asserting a sleep signal. A switch cell may be implemented by a PMOS or a NMOS transistor, depending on whether the connection to the power supply voltage reference (VDD) or the ground voltage reference (VSS) is controlled by the switch cell.

Until recently, power gating is a coarse-grained technique—i.e., relatively few power domains are provided in a circuit block or module of an integrated circuit, and typically places the entire circuit block or module into a standby state. More recently, fine-grained power gating techniques (i.e., many more power domains are provided in a circuit block, and placing only a portion of the circuit block in a standby state) have been developed, so that each power domain controls the active or power saving modes of a small portion of the circuit block or module. As a result, during operation, many power domains of the circuit block may be independently put into a standby mode, while other power domains in the same circuit block are active. These techniques reduce leakage power while the circuit block or module is in an active state (i.e., "active leakage power reduction").

Micro-architecture level techniques have been developed for power gating the execution units in microprocessors. Examples of such approaches include: (i) "*Micro-architectural Techniques for Power Gating of Execution Units*", by Hu et al., ISLPED 2004 Proceedings, pp 32-37, and "*Managing Static Leakage Energy in Microprocessor Functional Units*", by Dropsho et al., MICRO 2002 Proceedings, pp 321-332. Using dual-threshold domino logic circuits, these techniques provide analytical models for determining suitable sleep-mode activation policies for integer functional units of a microprocessor. However, both these techniques require adding significant amount of additional logic circuits to generate the sleep signal needed for power gating.

As another example, in "*A Scheme to Reduce Active Leakage Power by Detecting State Transitions*," Usami et al. use a clock enable signal to power-gate the fan-in logic cones of clock-gated registers. This technique, however, leads to a significant increase in critical path delays and is recommended for use only in conjunction with burn-in testing.

SUMMARY

The present invention provides a technique to automatically extend a clock-gated design for fine-grained power gating. Using this technique, both active leakage power reduction and dynamic power reduction may be achieved during active operation of the clock-gated design.

According to one embodiment, a method of the present invention extends a clock-gating technique to provide a sleep signal for controlling switch circuits that reduce active leakage power. Using this extension of the clock-gating technique, fine-grained power-gating is achieved. The method automatically identifies, at an RTL or a gate level, the logic circuits that can be power-gated. The method of the present invention derives a sleep signal for fine-grained power-gating that may be applicable to both time-critical and non-time-critical designs.

In one method, one or more registers are identified as being clocked by a gated clock signal derived from a combination of a clock signal and an enable signal. From those registers, a logic circuit in an output logic cone of the output signals of the registers is then identified. The method then provides a switch cell to be connected between the logic circuit and a voltage reference. A sleep signal derived from the enable signal to control the switch cell. In one embodiment, a latch provides the enable signal as the sleep signal to the logic circuit. In one embodiment, the gated clock signal is an output signal of an integrated clock-gating cell. In that embodiment, the latch outputting the sleep signal may be provided as a part of the integrated clock-gating cell. The switch cell may connect the logic circuit to either a power supply voltage reference or a ground voltage reference. A holder cell retains the output signals of the logic circuit during a time period in which the sleep signal is asserted.

In one embodiment, the enable signal is provided to the logic circuit through serially connected latches, which transfer a logic value from their input terminals to their output terminals at different logic levels of the clock signal. Alternatively, the enable signal is provided as a sleep signal through a flip-flop.

To meet a stringent timing requirement on powering up of the logic circuit, a signal path couples the enable signal to the sleep signal, such that the sleep signal is deasserted within a predetermined delay when the enable signal is asserted. In one implementation, the signal path comprises an OR gate that gates the enable signal with a signal derived from the gated clock signal.

The present invention is better understood upon consideration of the detailed description below and the accompanying drawings.

BRIEF DESCRIPTION OF THE DRAWINGS

FIG. 1(*b*) illustrates deriving the sleep signal for combination logic circuit C of FIG. 1(*a*) from enable signal 'En', according to one embodiment of the present invention.

FIG. 1(*c*) illustrates deriving the sleep signal for combination logic circuit C and register set A of FIG. 1(*a*) from enable signal 'En', according to one embodiment of the present invention.

To facilitate cross-reference among the figures, like elements in these figures are provided like reference numerals.

DETAILED DESCRIPTION OF THE PREFERRED EMBODIMENTS

Figure 1A:
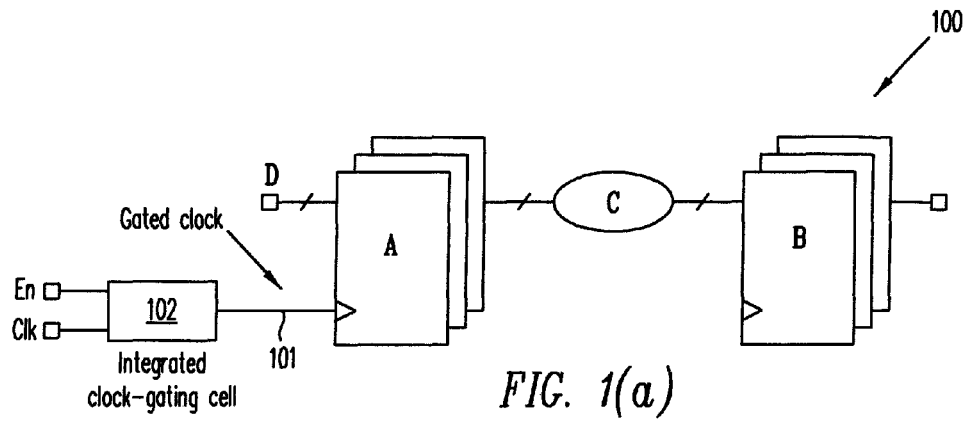
FIG. 1(*a*) illustrates, schematically, a clock-gated circuit 100.
Figure 2:
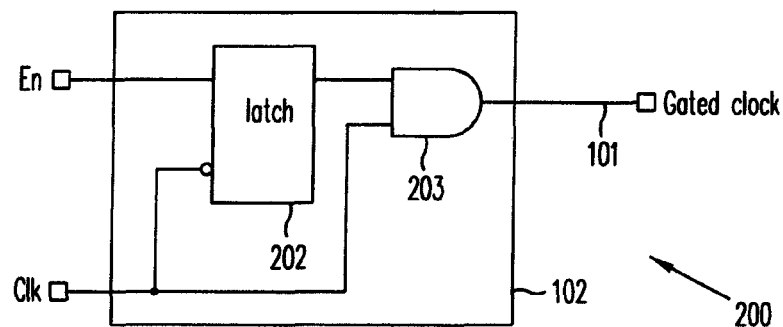
FIG. 2 shows structure 200, which is one example of an integrated clock-gating cell.

Clock-gating is a technique that reduces clock power dissipation. FIG. 1(a) illustrates clock-gated circuit 100 schematically. As shown in FIG. 1(a), register set A receives a clock signal 101 that results from gating clock signal "clk" with enable signal, "En" in an "integrated clock-gating cell" 102. The power dissipated by circuit propagating clock signal "clk" is termed "dynamic power dissipation." Clearly, by disabling propagation of clock signal "clk", dynamic power dissipation in the circuits clocked by clock signal "clk" and its derivative signals is reduced. FIG. 2 shows structure 200, which is an example of an integrated clock-gating (ICG) cell. As shown in FIG. 2, gated-clock signal 102 is provided by gating clock signal "clk" with the output signal of latch 202 in AND gate 203. Latch 202 may be implemented, for example, by a level-sensitive latch that transfers the logic value of enable signal "En" during the low logic level of clock signal "clk".

The inventor of the present invention observes that, while signal En is deasserted, the signals in the "fan-out logic cone" of register set A (i.e., the output signals of register set A and signals derived solely from these output signals), represented by the signals in combination logic circuit C, do not change. Based on this observation, the present invention provides a switch cell and an associated sleep signal to power-gate combinational logic circuit C, as illustrated by FIG. 1(b).

Figure 1B:
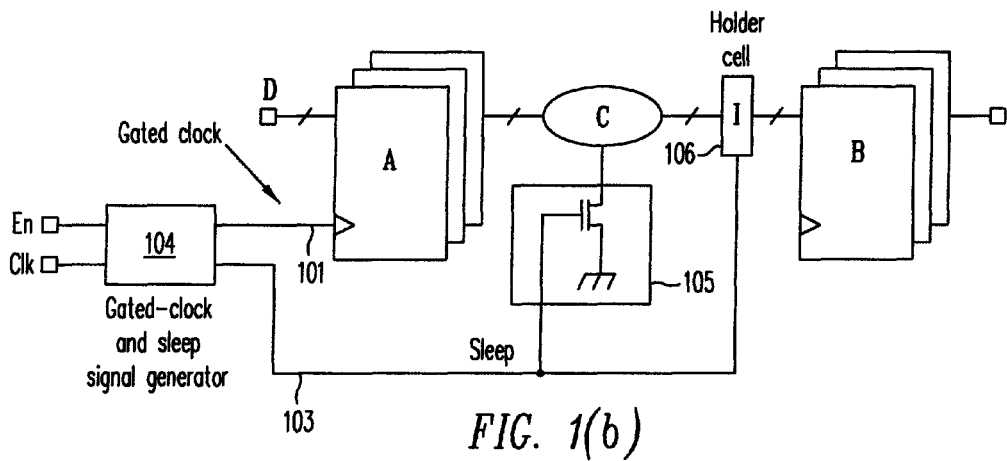
Figure 1C:
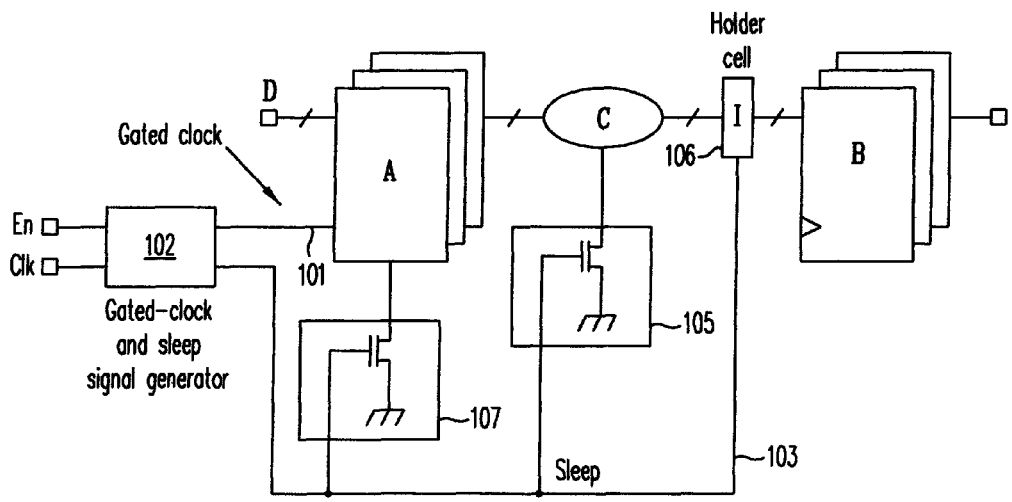

FIG. 1(b) illustrates deriving the sleep signal for combination logic circuit C of FIG. 1(a) from enable signal 'En', according to one embodiment of the present invention. As shown in FIG. 1(b), a modified integrated clock-gating cell 104 provides a sleep signal 103, in addition to gated clock signal 101. Sleep signal 103 controls switch cell 105, which selectively connects and disconnects combination logic C to the ground voltage reference in the active and sleep modes, respectively. Further, sleep signal 103 is also provided to holder cell 106, which retains the output states of combinational logic C, while combinational logic C is in the sleep mode. In a design where states of register set A need not be saved, register set A can also be power-gated by switch cell 107 to further reduce leakage power, such as illustrated in FIG. 1(c).

Therefore, the technique illustrated by the above embodiments of the present invention identifies at the register-transfer level (RTL) the logic circuit that can be power-gated. This identification can be achieved in a design automation tool using, for example, a conventional technique that traces the fan-out logic cone of the output signals of registers sets controlled by a gated clock signal. At RTL, power-gating according to the present invention can be implemented without affecting the timing constraints of the design. Further, as illustrated below, this technique requires little additional overhead cost to generate the sleep signal.

Figure 3A:
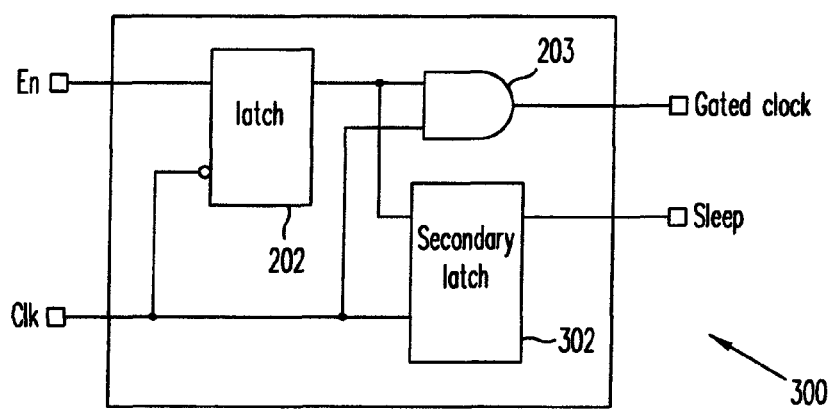
FIG. 3(a) shows integrated clock-gated cell 300, which may used, for example, to implement integrated clock-gating cell 104 of FIG. 1(b), according to one embodiment of the present invention.

FIG. 3(a) shows integrated clock-gated cell 300, which may be used, for example, to implement integrated clock-gating cell 104 of FIG. 1(b), according to one embodiment of the present invention. Integrated clock-gating cell 300 includes a level-sensitive latch ("secondary latch") 302, which holds the logic value of enable signal 'En' provided at the output terminal of latch 202 during the high logic level of clock signal "clk".

Figure 3B:
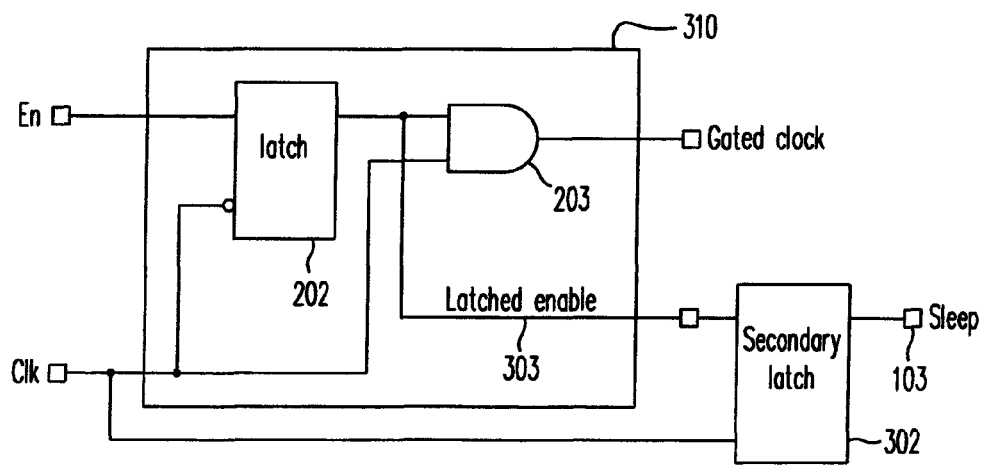
FIGS. 3(b), 3(c) and 3(d) are variations of circuit 300 of FIG. 3(a).

FIG. 3(b) shows a variation of circuit 300 of FIG. 3(a). In FIG. 3(b), rather than including secondary latch 302 in an integrated clock-gated cell, as in FIG. 3(a), secondary latch can be provided outside of an integrated clock-gated cell. As shown in FIG. 3(b), integrated clock-gated cell 310 is substantially the same as integrated clock-gated cell 200, except that output signal 303 of latch 202, which is internal to the integrated clock-gated cell is brought outside of the cell to secondary latch 302.

Figure 3C:
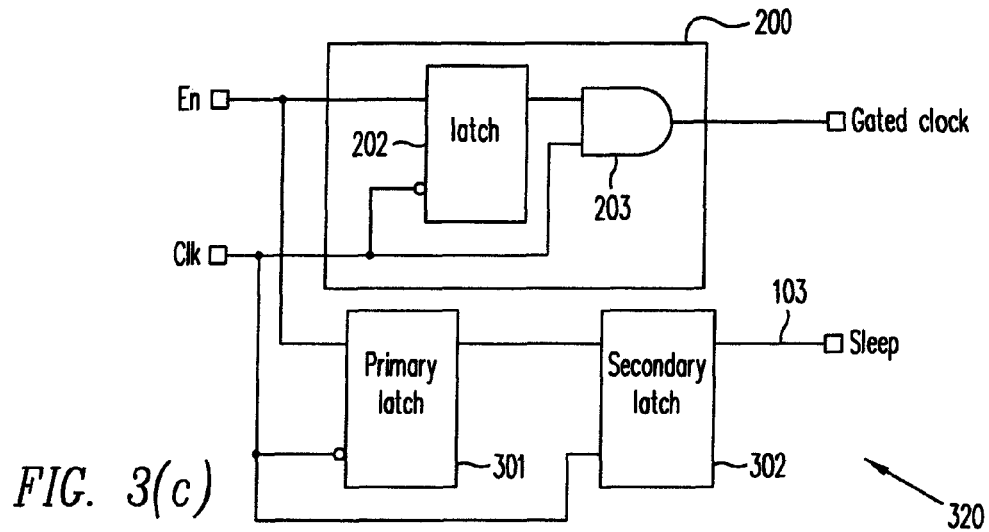

FIG. 3(c) shows circuit 320, which is a further variation of circuit 300 of FIG. 3(a). In FIG. 3(c), latch 202 is not used for both sleep signal generation and clock-gating, as in FIG. 3(a). Instead, an additional latch 301 is provided to latch enable signal 'En' when clock signal "clk" is at a low logic value.

Figure 3D:
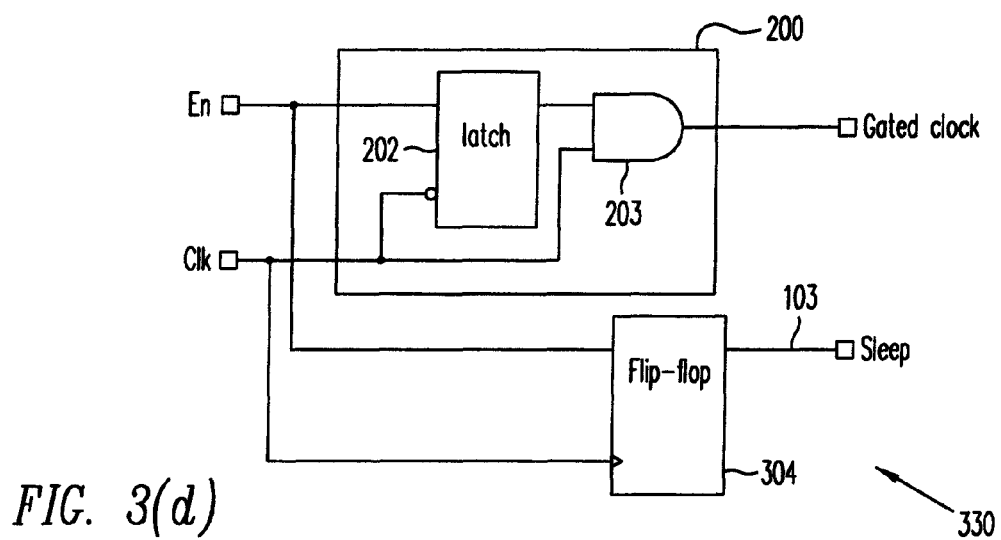
Figure 4A:
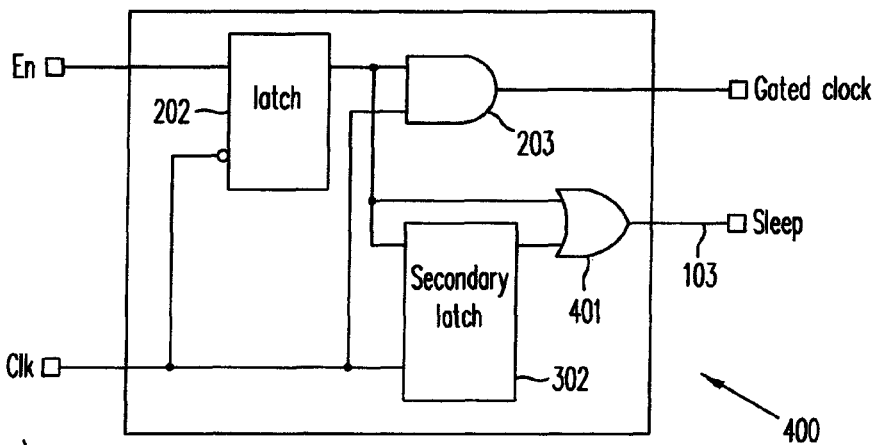
FIG. 4(a)-4(d) showing circuits 400, 410, 420 and 430, which are circuits 300, 310, 320 and 330 of FIGS. 3(a)-3(d), respectively, modified by the addition of OR-gate 401, in accordance with one embodiment of the present invention.
Figure 4B:
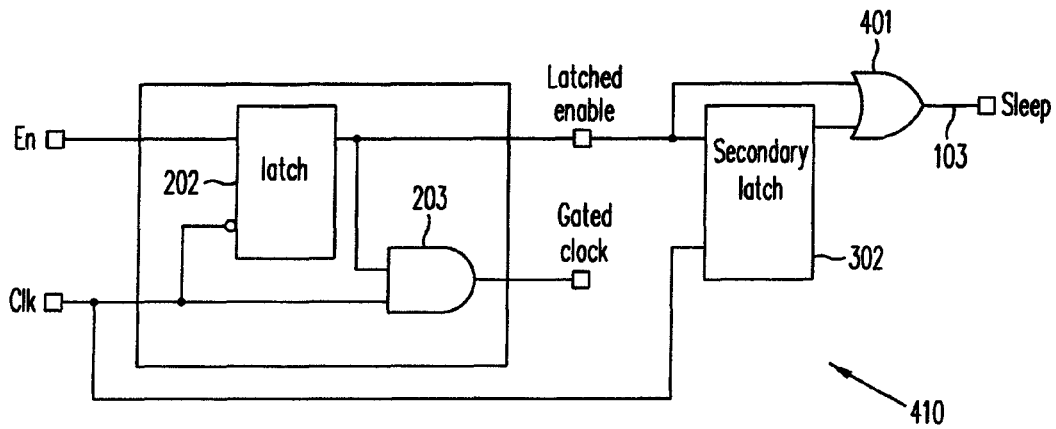
Figure 4C:
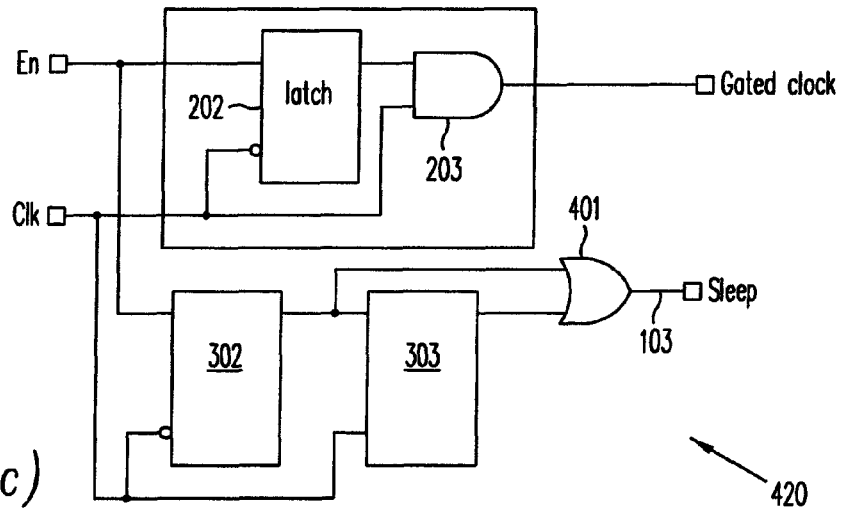
Figure 4D:
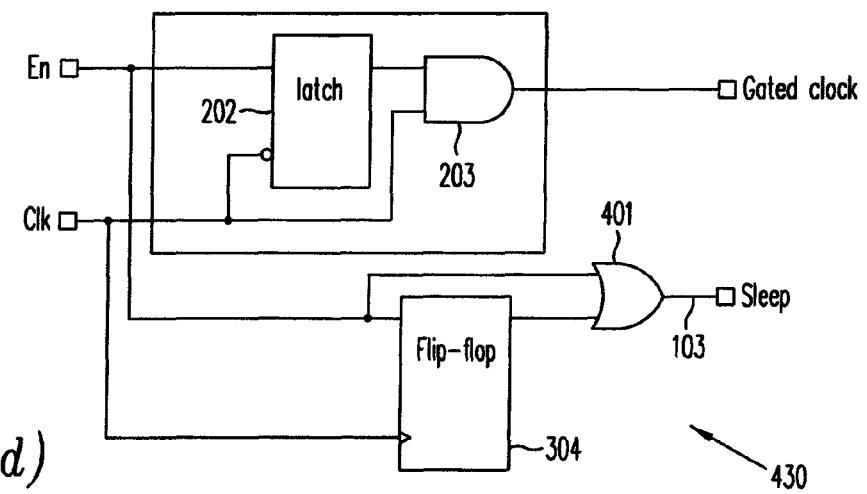

FIG. 3(d) shows circuit 330, which is a further variation of circuit 300 of FIG. 3(a). In FIG. 3(d), latch 202 is also not used for both sleep signal generation and clock-gating, as in FIG. 3(a). Instead, flip-flop 304 is provided to latch enable signal 'En' at a low-going transition of clock signal "clk".

In a time-critical design, the wake-up time associated with the power-gated logic may cause the power-gated circuits described above not to meet timing constrains. For such a design, a 2-input OR gate can be provided to gate the enable signal "En" with the output signal of the secondary latch (i.e., latch 302 in FIGS. 3(a), 3(b) and 3(c) and flip-flop 304 in FIG. 3(d)). The 2-input OR allows sleep signal 103 to be deasserted (i.e., to go to a logic high state) without the propagation delay through the secondary latch, thereby allowing time for the power-gated logic circuit (e.g., combinational logic circuit C) to wake up. FIG. 4(a)-4(d) showing circuits 400, 410, 420 and 430, which are circuits 300, 310, 320 and 330 of FIGS. 3(a)-3(d), respectively, modified by the addition of OR-gate 401, in the manner discussed above.

In circuits 400, 410, 420 and 430 of FIGS. 4(a)-4(d), a glitch in enable signal "En" may be propagated in sleep signal 103 by 2-input OR-gate 401 during sleep mode. Such a glitch in sleep signal 103 may cause leakage and perhaps rush currents.

The above-detailed description is provided to illustrate the specific embodiments of the present invention and is not intended to be limiting. Numerous variations and modifications within the scope of the present invention are possible. The present invention is set forth in the following claims.

I claim:

1. A circuit for power gating a logic circuit receiving one or more signals from output signals of one or more registers, comprising:

a switch circuit connecting the logic circuit to a voltage reference, the switch cell being controlled by a sleep signal; and a clock-gating circuit receiving an enable signal and a clock signal, the clock-gating circuit deriving both a gated clock signal to clock the registers and the sleep signal based on the enable signal, the clock-gating circuit providing, in respond to a signal transition in the enable signal, a signal transition in the sleep signal earlier than a corresponding signal transition in the gated clock signal.

2. A circuit as in claim 1, wherein the clock-gating circuit provides the enable signal as the sleep signal through a latch.

3. A circuit as in claim 2, wherein the clock-gating circuit comprises an integrated clock-gating cell that outputs the gated clock signal, and a latch that outputs the enable signal as the sleep signal.

4. A circuit as in claim 2, wherein the latch is a part of the integrated clock-gating cell.

5. A circuit as in claim 1, wherein the voltage reference is a ground voltage reference.

6. A circuit as in claim 1, wherein the gated clock signal is an output signal of an integrated clock-gating cell.

7. A circuit as in claim 1, further comprising a holder cell that retains the output signals of the logic circuit during a time period in which the sleep signal is asserted.

8. A circuit as in claim 1, wherein the enable signal is provided through a first latch and a second latch, wherein the first latch and the second latch transfer a logic value from their input terminals to their output terminals at different logic levels of the clock signal.

9. A circuit as in claim 1, wherein the enable signal is provided to the logic circuit through a flip-flop.

10. A circuit as in claim 1, wherein a signal path couples the enable signal to the sleep signal such that the sleep signal is deasserted within a predetermined delay when the enable signal is asserted.

11. A circuit as in claim 1, wherein the signal path comprises an OR gate that gates the enable signal with a signal derived from the gated clock signal.

12. A method for power gating, comprising:
identifying one or more registers that are clocked by a gated clock signal derived from a combination of a clock signal and an enable signal, wherein the enable signal is provided through a first latch and a second latch;
identifying one or more logic circuits receiving one or more input signals that are derived from output signals of the one or more registers;
providing a switch cell to be connected between the logic circuits and a voltage reference, and
controlling the switch cell using a sleep signal derived from the enable signal, wherein the sleep signal is delayed from the enable signal for a predetermined time period.

13. A method as in claim 12, wherein the enable signal is provided as the sleep signal to the logic circuit through the second latch.

14. A method as in claim 12, wherein gated clock signal is an output signal of an integrated clock-gating cell, and wherein the enable signal is provided as the sleep signal to the logic circuits through the second latch.

15. A method as in claim 13, wherein the second latch is a part of the integrated clock-gating cell.

16. A method as in claim 12, wherein the voltage reference is a ground voltage reference.

17. A method as in claim 12, wherein the gated clock signal is an output signal of an integrated clock-gating cell.

18. A method as in claim 12, further comprising retaining in a holder cell the output signals of the logic circuit during a time period in which the sleep signal is asserted.

19. A method as in claim 12, wherein the first latch and the second latch transfer a logic value from their input terminals to their output terminals at different logic levels of the clock signal.

20. A method as in claim 12, wherein the enable signal is provided through a flip-flop.

21. A method as in claim 12, wherein a signal path couples the enable signal to the sleep signal such that the sleep signal is deasserted within the predetermined delay when the enable signal is asserted.

* * * * *